(12) United States Patent
Shigeta

(10) Patent No.: US 12,732,723 B2
(45) Date of Patent: Sep. 8, 2026

(54) CIRCUIT BOARD, IMAGE SENSOR, AND IMAGE SENSOR MANUFACTURING METHOD

(71) Applicant: Mitsubishi Electric Corporation, Tokyo (JP)

(72) Inventor: Hiroaki Shigeta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 19/154,398

(22) PCT Filed: Mar. 27, 2024

(86) PCT No.: PCT/JP2024/012173
§ 371 (c)(1),
(2) Date: Aug. 7, 2025

(87) PCT Pub. No.: WO2024/247464
PCT Pub. Date: Dec. 5, 2024

(65) Prior Publication Data

US 2026/0113553 A1 Apr. 23, 2026

(30) Foreign Application Priority Data

Jun. 2, 2023 (JP) ................................ 2023-091875

(51) Int. Cl.
*H04N 25/79* (2023.01)
*H03K 19/21* (2006.01)
*H04N 25/701* (2023.01)

(52) U.S. Cl.
CPC ............. *H04N 25/79* (2023.01); *H03K 19/21* (2013.01); *H04N 25/701* (2023.01)

(58) Field of Classification Search
CPC ....... H04N 25/79; H04N 25/701; H03K 19/21
See application file for complete search history.

(56) References Cited

U.S. PATENT DOCUMENTS 6,184,513 B1 2/2001 Sawada
2002/0003438 A1 1/2002 Hayakawa
(Continued)

FOREIGN PATENT DOCUMENTS

JP S55-167595 U 12/1980
JP H07-152815 A 6/1995
(Continued)

OTHER PUBLICATIONS

International Search Report and Written Opinion mailed on Jun. 18, 2024, received for PCT Application PCT/JP2024/012173, filed on Mar. 27, 2024, 8 pages including English Translation.
(Continued)

*Primary Examiner* — Lin Ye
*Assistant Examiner* — Tuan H Le
(74) *Attorney, Agent, or Firm* — XSENSUS LLP

(57) ABSTRACT

Each of circuit boards functioning as boards includes a switch including four or more selection pins, a logic circuit, and electronic components. The logic circuit outputs an ON signal from one output terminal selected from four or more output terminals independent from each other, when receiving an ON signal input from only a predetermined one selection pin of the selection pins and receiving OFF signals input from all the other selection pins. The electronic components are activated or deactivated in accordance with signals output from the logic circuit.

7 Claims, 11 Drawing Sheets

(56) References Cited

U.S. PATENT DOCUMENTS

2011/0261615 A1* 10/2011 Choi .................. G11C 13/0004
365/163
2018/0367154 A1* 12/2018 Choo .................... H03L 7/1075
2022/0216860 A1* 7/2022 Kimura ..................... G06F 1/10
2023/0023133 A1* 1/2023 Tayu .................. H03K 19/1733
2023/0118600 A1* 4/2023 Tsuchiya .............. H04N 25/773
348/302

FOREIGN PATENT DOCUMENTS

JP H10-214952 A 8/1998
JP 2001-244808 A 9/2001
JP 2002-093265 A 3/2002

OTHER PUBLICATIONS

Notice of Reasons for Refusal mailed on Dec. 3, 2024, received for JP Application 2024-560307, 9 pages including English Translation.
Feb. 12, 2025, received for JP Application 2024-560307, 5 pages including.
Decision to Grant a Patent mailed on English Translation.

* cited by examiner 1
52
51
53
40
40
41
52
53
40
80
53
51
52
10h
22
10g
22
10f
31
22
10e
22
10d
30
22
10c
22
10b
21
25
10a
21
70
X
Z
Y

FIG. 6

| | | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | | 0000 | 0001 | 0010 | 0011 | 0100 | 0101 | 0110 | 0111 | 1000 | 1001 | 1010 | 1011 | 1100 | 1101 | 1110 | 1111 |
| 0 | 0000 | H | H | H | H | H | H | H | H | H | H | H | H | H | H | H | H |
| 1 | 0001 | H | H | H | H | H | H | H | H | H | H | H | H | H | H | H | H |
| 2 | 0010 | H | H | H | H | H | H | H | H | H | H | H | H | H | H | H | H |
| 3 | 0011 | H | H | H | H | H | H | H | H | H | H | H | H | H | H | H | L |
| 4 | 0100 | H | H | H | H | H | H | H | H | H | H | H | H | H | H | H | H |
| 5 | 0101 | H | H | H | H | H | H | H | H | H | H | H | H | H | H | H | H |
| 6 | 0110 | H | H | H | H | H | H | H | H | H | H | H | H | H | H | H | H |
| 7 | 0111 | H | H | H | H | H | H | H | H | H | H | H | H | H | H | H | L |
| 8 | 1000 | H | H | H | H | H | H | H | H | H | H | H | H | H | H | H | H |
| 9 | 1001 | H | H | H | H | H | H | H | H | H | H | H | H | H | H | H | H |
| 10 | 1010 | H | H | H | H | H | H | H | H | H | H | H | H | H | H | H | H |
| 11 | 1011 | H | H | H | H | H | H | H | H | H | H | H | H | H | H | H | L |
| 12 | 1100 | H | H | H | H | H | H | H | H | H | H | H | H | H | H | H | L |
| 13 | 1101 | H | H | H | H | H | H | H | H | H | H | H | H | H | H | H | L |
| 14 | 1110 | H | H | H | H | H | H | H | H | H | H | H | H | H | H | H | L |
| 15 | 1111 | H | H | H | L | H | H | H | L | H | H | H | L | L | L | L | H |

COLUMNS CORRESPONDING TO PINS $P_3$, $P_7$, $P_4$, AND $P_8$ OF DIP-SW
ROWS CORRESPONDING TO PINS $P_1$, $P_5$, $P_2$, AND $P_6$ OF DIP-SW

FIG. 7A

| DIP-SW $P_1$ \ DIP-SW $P_5$ | L | H |
|---|---|---|
| L | H | L |
| H | L | H |

FIG. 7B

| DIP-SW $P_2$ \ DIP-SW $P_6$ | L | H |
|---|---|---|
| L | H | L |
| H | L | H |

FIG. 7C

| DIP-SW $P_3$ \ DIP-SW $P_7$ | L | H |
|---|---|---|
| L | H | L |
| H | L | H |

FIG. 7D

| DIP-SW $P_4$ \ DIP-SW $P_8$ | L | H |
|---|---|---|
| L | H | L |
| H | L | H |

FIG. 8

| SECOND LOGIC CIRCUIT \ FIRST LOGIC CIRCUIT | L | H |
|---|---|---|
| L | L | H |
| H | H | H |

FIG. 9

| DIP-SW $P_1 \sim P_8$ \ THIRD LOGIC CIRCUIT | L | H |
|---|---|---|
| L | L | H |
| H | H | H |

FIG. 10

| LOGIC CIRCUIT OUTPUT | DIP-SW | OUTPUT LEVEL |
|---|---|---|
| $S_1$ | ONLY $P_1$ AT L LEVEL (ON) | L |
| $S_5$ | ONLY $P_5$ AT L LEVEL (ON) | L |
| $S_2$ | ONLY $P_2$ AT L LEVEL (ON) | L |
| $S_6$ | ONLY $P_6$ AT L LEVEL (ON) | L |
| $S_3$ | ONLY $P_3$ AT L LEVEL (ON) | L |
| $S_7$ | ONLY $P_7$ AT L LEVEL (ON) | L |
| $S_4$ | ONLY $P_4$ AT L LEVEL (ON) | L |
| $S_8$ | ONLY $P_8$ AT L LEVEL (ON) | L |

FIG. 12

CIRCUIT BOARD, IMAGE SENSOR, AND IMAGE SENSOR MANUFACTURING METHOD

CROSS-REFERENCE TO RELATED APPLICATIONS

This application is a national stage application, pursuant to 35 U.S.C. § 371, of International Patent Application No. PCT/JP2024/012173, filed Mar. 27, 2024, which claims priority to Japanese Patent Application No. 2023-091875, filed Jun. 2, 2023, the entire contents of each are incorporated herein by reference.

TECHNICAL FIELD

The present disclosure relates to a circuit board, an image sensor, and a method of fabricating an image sensor.

BACKGROUND ART

Some image sensors include sensor integrated circuits (ICs) aligned in the longitudinal direction to read image. Such an image sensor includes, in accordance with increases in the length and speed of its sensor unit, a larger number of signal processing ICs, such as field programmable gate arrays (FPGAs) or analog front ends (AFEs) in a signal processing unit. These signal processing ICs are assigned to multiple circuit boards because of the limited number of signal processing ICs mountable on a single circuit board. The circuit boards are synchronized with each other and process image signals read from the sensor ICs.

The circuit boards in the signal processing unit may have mutually different lengths and include mutually different types of components, depending on the functions and the order of alignment of the circuit boards, for example. Such differences between the circuit boards complicate the processes of managing and mounting the components, and may result in cost increases and mistakes in the mounting process. In order to reduce the number of types of circuit boards, some techniques (for example, Patent Literature 1) have been developed that use switches for activating or deactivating components of the circuit boards or switching their wirings.

Patent Literature 1 discloses a semiconductor integrated circuit that includes keeper circuits that retain the results of logical operations of three logical operation circuits, and three inverters connected to the respective output terminals of the logic operation circuits. The semiconductor integrated circuit having this configuration, when the signal output from any one of the first logic operation circuits is at a low level, forcibly adjusts the signals output from the other first logic operation circuits to a high level. The semiconductor integrated circuit can thus set only one output terminal at a high level.

CITATION LIST

Patent Literature

Patent Literature 1: Unexamined Japanese Patent Application Publication No. 2001-244808

SUMMARY OF INVENTION

Technical Problem

An image sensor needs to read one line of an image using a single synchronization signal, while multiple boards synchronize to acquire sensor signals and output image signals. The image sensor thus requires at least two types of boards, including a type of boards that output reference clock signals and synchronization signals and a type of boards that receive the signals. In addition, the image sensor requires multiple types of boards having different numbers of signal-processing pixels in the longitudinal direction, in order to adjust the longitudinal length of the image reading area to match the specifications of an image reading apparatus.

The semiconductor integrated circuit disclosed in Patent Literature 1 includes the logic circuits that select one of the three terminals and output a signal through the selected terminal in accordance with eight input signals Q1 to Q8. The logic circuits demonstrated in Patent Literature 1 are, however, not able to configure multiple types of boards having different functions by selection of components or wires of common boards in an image sensor, because the logic circuits have output terminals less than their input terminals.

An objective of the present disclosure, which has been accomplished in view of the above-described situation, is to provide a circuit board that can function as multiple types of boards having different components or wires, an image sensor, and a method of fabricating an image sensor.

Solution to Problem

In order to achieve the above objective, a circuit board according to the present disclosure includes a switch including four or more selection pins, a logic circuit, and electronic components. The logic circuit outputs an ON signal from one output terminal selected from four or more output terminals independent from each other, when receiving an ON signal input from only a predetermined one selection pin of the selection pins and receiving OFF signals input from all the other selection pins. The electronic components are activated or deactivated in accordance with signals output from the logic circuit.

Advantageous Effects of Invention

In the present disclosure, the electronic components are activated or deactivated in accordance with signals output from the logic circuit in accordance with signals input from the selection pins of the switch. This circuit board can thus function as multiple types of boards having different components or wires.

BRIEF DESCRIPTION OF DRAWINGS

FIG. 6 illustrates a truth table of the first logic circuit;

FIG. 7A illustrates a truth table of first and fifth pins of a second logic circuit;

FIG. 7B illustrates a truth table of second and sixth pins of the second logic circuit;

FIG. 7C illustrates a truth table of third and seventh pins of the second logic circuit;

FIG. 7D illustrates a truth table of fourth and eighth pins of the second logic circuit;

FIG. 8 illustrates a truth table of a third logic circuit;

FIG. 9 illustrates a truth table of a fourth logic circuit;

FIG. 10 illustrates signals input to and output from the logic circuit;

FIG. 12 is a sectional view of wires among boards of an image sensor according to a modification of the embodiments.

DESCRIPTION OF EMBODIMENTS

Embodiment 1

The following describes an image sensor 1 according to an embodiment of the present disclosure, with reference to the accompanying drawings. The image sensor 1 may be any line sensor including linearly aligned sensor ICs. A typical example of the image sensor 1 is a contact image sensor (CIS) generated by integrating sensor ICs, a light source, and a lens array with each other.

Figure 1:
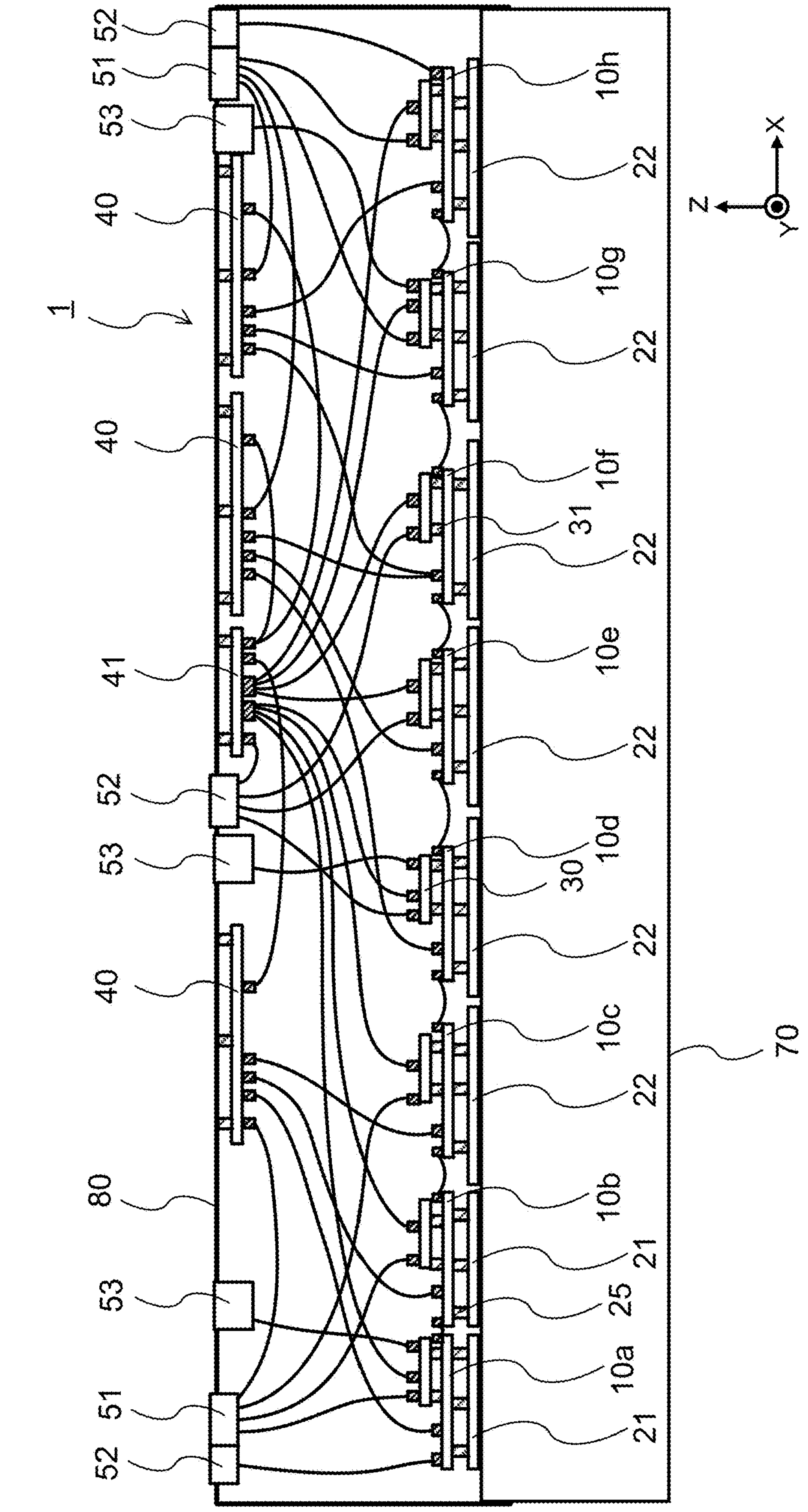
FIG. 1 is a sectional view of wires among boards of an image sensor according to Embodiment 1 of the present disclosure.

FIG. 1 is a sectional view of wires among boards of the image sensor 1 according to this embodiment. The X-axis direction indicates the longitudinal direction of the image sensor 1, the Y-axis direction indicates the transverse direction of the image sensor 1, and the Z-axis direction indicates the height direction orthogonal to both the longitudinal and transverse directions. The longitudinal direction and the transverse direction of the image sensor 1 according to the embodiment respectively correspond to the main scanning direction and the sub-scanning direction of the image sensor 1.

As illustrated in FIG. 1, the image sensor 1 includes a frame 70 that retains optical components and boards 21 and 22 for signal processing, and a cover 80 that covers the entire frame 70. The cover 80 is provided with various connectors including connectors 51 that feed power to individual boards and connectors 52 that output signals for controlling illumination, fans 53 for air cooling, and boards 40 and 41 that control the image sensor 1, for example. The frame 70 and the cover 80 are made of aluminum, for example.

The boards 21 and 22 fixed on the frame 70 each include an analog to digital (A/D) conversion circuit that converts analog signals output from a sensor IC into digital signals. Specifically, one or more boards 21 and one or more boards 22 are aligned in the main scanning direction. The boards 21 have a length different from that of the boards 22 in the main scanning direction so as to adjust the length of the image sensor 1 in the main scanning direction to a predetermined length. Specifically, the boards 21 are shorter than the boards 22.

Each of the boards 21 and 22 is provided with one of boards 10*a* to 10*h* (hereinafter collectively referred to as "boards 10" in some contexts) via spacers 25. The boards 10*a* to 10*h* perform required image processing on digital signals output from the boards 21 and 22. The boards 10*a* to 10*h* receive and output reference clock signals, synchronization signals, or control signals.

The boards 10*a* to 10*h* have the identical size, components, and wires. The functions of the boards 10 are switchable by manipulations of physical switches. The number of boards 10 is any number equal to or larger than two. The boards 10 include at least a board that transmits synchronization signals based on reference clock signals and a board that receives the synchronization signals. The boards 10 include two or more boards of multiple types having different numbers of signal-processing pixels in the main scanning direction, in order to adjust the length of the image reading area in the main scanning direction to a predetermined length. The description of this embodiment focuses on an example regarding 8-channel DIP switches as the physical switches and the boards 10 consisting of eight boards 10*a* to 10*h*. The boards 10*a* to 10*h* are described in detail below.

Each of the boards 10*a* to 10*h* is provided with a board 30 via spacers 31. The boards 30 feed power to the individual boards 10*a* to 10*h*, and transmit and receive communication signals to and from the boards 10*a* to 10*h*.

The frame 70 of the image sensor 1 may further include a light source that emits light to a reading target, and a control board for the light source. A typical example of the light source is a light emitting diode (LED).

The boards 40 fixed on the cover 80 are connected to the boards 10*a* to 10*h* via wires. The boards 40 convert image signals generated through image processing by the boards 10*a* to 10*h* into signals of a predetermined standard, and transmit the converted signals to the outside. The standard of the signals to be transmitted to the outside is any standard, examples of which include CameraLink (registered trademark), CoaXPress (registered trademark), GigE Vision (registered trademark), and USB3 Vision (registered trademark).

The board 41 fixed on the cover 80 includes a microcomputer that centrally manages the entire image sensor 1 and is connected to the boards 30 via wires. The board 41 transmits and receives control signals to and from the boards 10 and 30 and the outside.

The following describes some operations of the image sensor 1. First, the sensors ICs receive light emitted from a light source and transmitted through or reflected from the reading target, and output analog signals. The A/D conversion circuits of the boards 21 and 22 convert the analog signals input from the sensor ICs into digital signals. The converted digital signals are subject to signal processing involving rearrangement of image data by the boards 10*a* to 10*h*, and transmitted to the boards 40 via the wires. The boards 40 convert the received image signals into signals of a predetermined standard, and transmit the converted signals to the outside.

In addition, the boards 40 receive control signals input from the outside, and output the control signals to the microcomputer of the board 41. In accordance with the received control signals, the microcomputer of the board 41 transmits control signals to the boards 10*a* to 10*h* via the wires and the boards 30, and thus controls the boards 10*a* to 10*h*. The boards 10*a* to 10*h* of the image sensor 1 according to this embodiment is characterized by being made of circuit boards of a single type.

Figure 2:
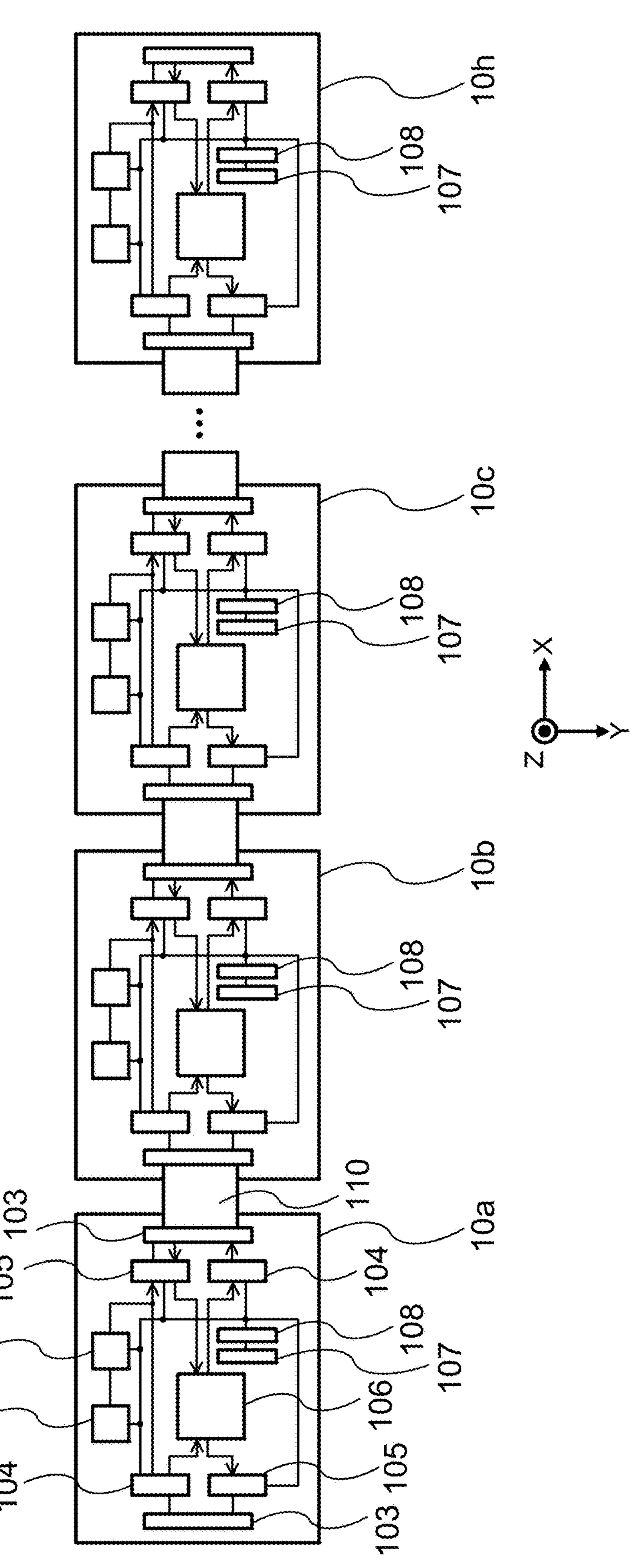
FIG. 2 is a top view of a series of boards for image processing included in the image sensor.
Figure 3:
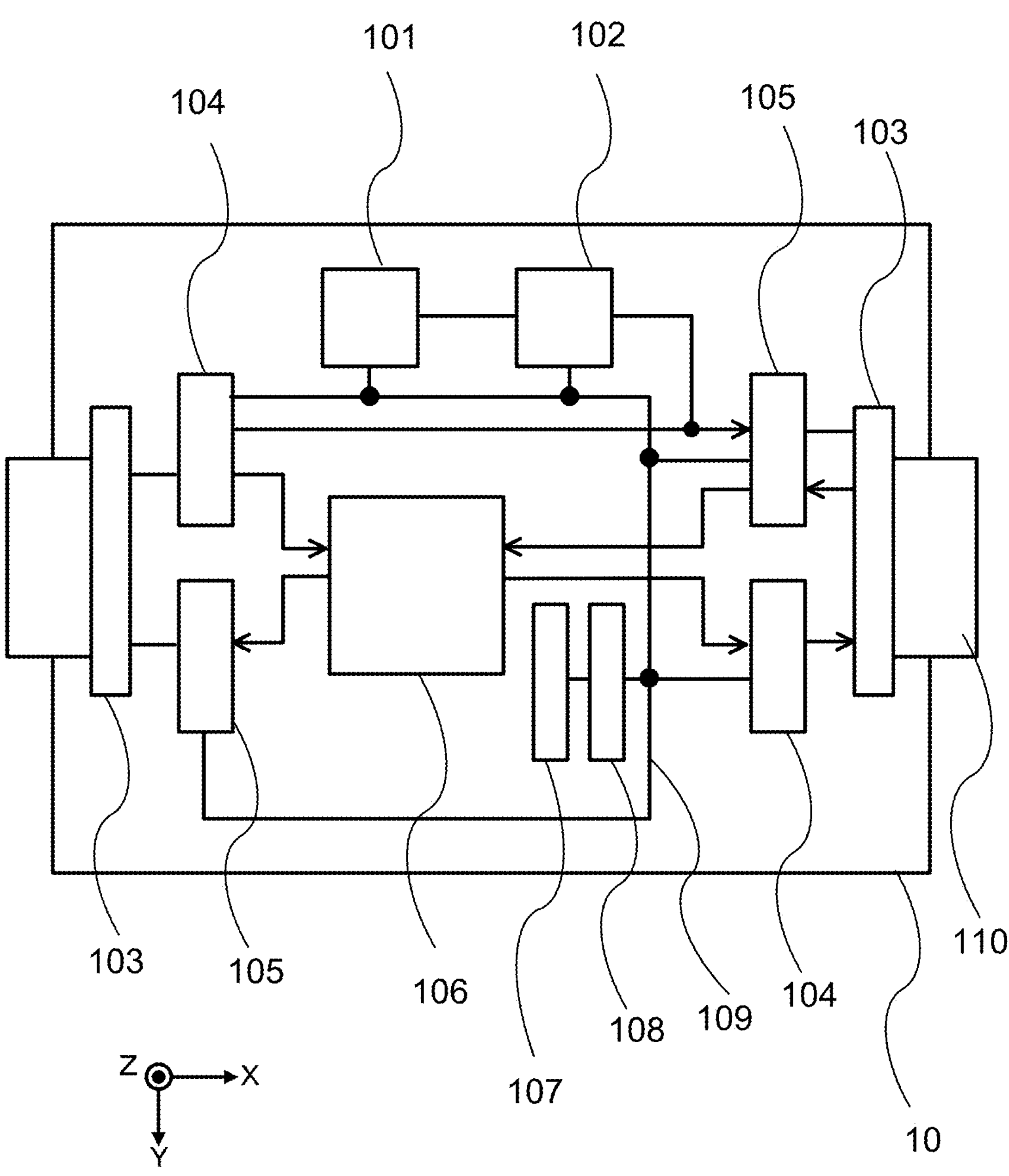
FIG. 3 is a top view of one of the boards for image processing included in the image sensor.

FIG. 2 is a top view of a series of boards 10*a* to 10*h* for image processing aligned in the main scanning direction. Each adjacent two of the boards 10 are connected to each other. FIG. 3 is a top view of one of the boards 10. The boards 10*a* to 10*h* are circuit boards of a single type that include the identical components and wires, and activate or deactivate the components by a manipulation of a switch 107.

As illustrated in FIGS. 2 and 3, for example, each of the boards 10 includes a main clock 101, a buffer 102 that conditions reference clock signals output from the main clock 101, connectors 103 for cables that electrically connects the boards to each other, buffers 104 that condition signals input from the previous board, buffers 105 that condition signals to be transmitted to the previous board, and a signal processing IC. A typical example of the signal processing IC is a field programmable gate array (FPGA) 106.

The board 10 further includes the switch 107 that selects modes including active and inactive modes of electronic components of the board 10, and a logic circuit 108 that performs logical operations on signals output from the switch 107 and outputs resulting signals. As illustrated in FIG. 3, the logic circuit 108 has four or more output terminals connected to the enable terminals of the main clock 101 and the respective buffers 102, 104, and 105 via wires 109. Each of the connectors 103 of the board 10 is connected via a cable 110 to the connector 103 of the adjacent board 10.

The following describes the switch 107 and the logic circuit 108 in detail, with reference to FIGS. 4 to 10. The switch 107 is a physical switch having four or more channels. A typical example of the switch 107 is an 8-channel DIP switch (referred to as "DIP-SW" in the drawings). The switch 107 has terminals connected to the ground, and pulled-up selection pins serving as the other terminals. The selection pins correspond to first to eighth pins $P_1$ to $P_8$. Each of the selection pins is set at a low level when the switch 107 is turned on, or it short-circuits, and is set at a high level when the switch 107 is turned off, or it is insulated.

The logic circuit 108 outputs, when receiving an ON signal from only one of the four or more selection pins of the switch 107 and receiving OFF signals from all the other pins, an ON signal from any one output terminal selected from the four or more output terminals independent from each other as a result of logical operations. The description of the embodiment focuses on an exemplary switch 107 having eight channels. That is, the logic circuit 108 outputs, when receiving an ON signal at a low level from only one of the first to eighth pins $P_1$ to $P_8$ of the switch 107 and receiving OFF signals at a high level from all the other pins, an ON signal at a low level from any one output terminal selected from the output terminals $S_1$ to $S_8$ independent from each other as a result of logical operations. The signals at a low or high level from the logic circuit 108 are input, as enable signals, to the enable terminals of the buffers 102, 104, and 105, and thus activate or deactivate the buffers.

For example, the logic circuit 108 performs logical operations so as to output a signal at a low level from only the output terminal $S_1$ of the logic circuit 108 when the first pin $P_1$ of the switch 107 is set at a low level. In this case, the ON signal output from the output terminal $S_1$ of the logic circuit 108 is input to the buffer 102 through a manipulation of turning on only the first channel of the switch 107, and activates the buffer 102, thereby allowing clock signals of the main clock 101 to be output within the circuit.

In contrast, when at least any one of the second to eighth channels of the switch 107 of the first board **10*a* is turned on, the output terminal $S_1$ of the logic circuit 108 outputs a signal at a high level, and deactivates the buffer 102, thereby allowing no clock signal to be output within the circuit. The switch 107 can thus certainly select the board allowing for output of clock signals. When multiple channels of the switch 107 are turned on by mistake, the logic circuit 108** outputs signals at a high level, and can thus avoid signal collision due to erroneous manipulations.

Alternatively, the signals output from the logic circuit 108 may be input to the enable terminal of the main clock 101 to start or stop the oscillation of the clock. The signals output from the logic circuit 108 may also be input to the enable terminals of the buffers 104 and 105 to control signal transmission between the boards.

Figure 4:
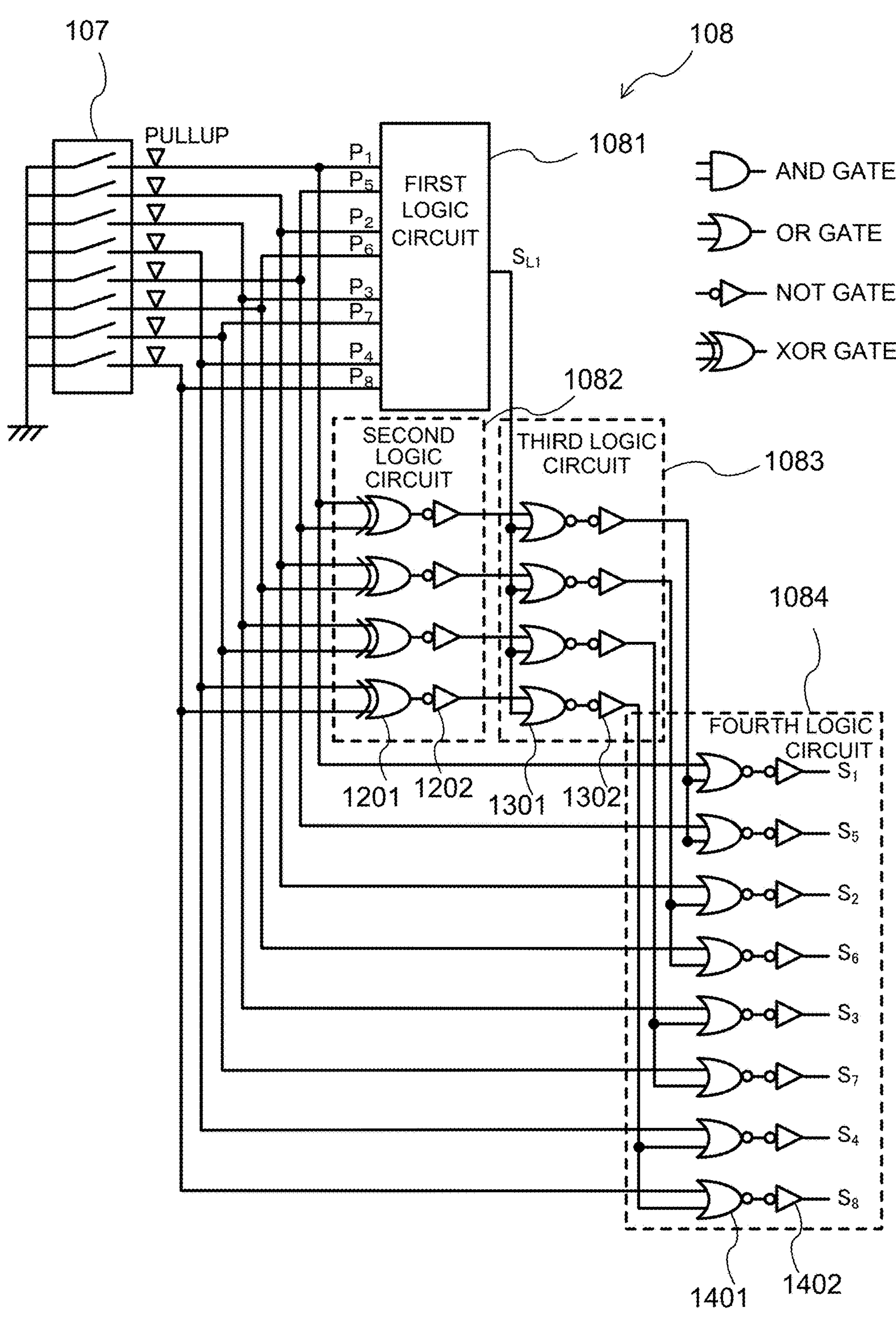
FIG. 4 is a circuit diagram illustrating a whole logic circuit.
Figure 5:
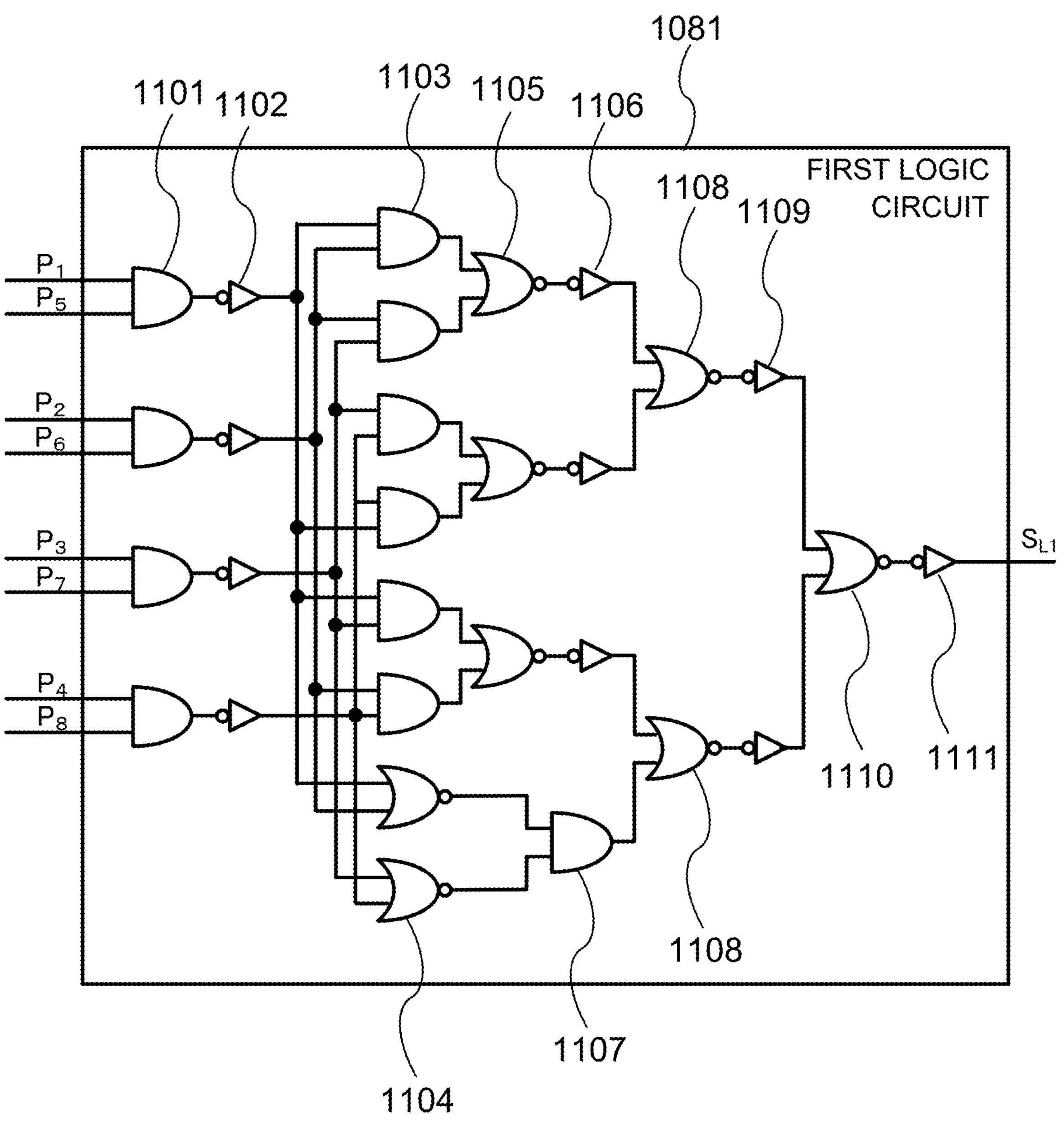
FIG. 5 is a circuit diagram illustrating a first logic circuit.

The following describes an exemplary configuration of the logic circuit 108, with reference to FIGS. 4 to 10. FIG. 4 illustrates an entire configuration of the logic circuit 108. FIG. 5 illustrates a configuration of a first logic circuit 1081 that constitutes a part of the logic circuit 108. As illustrated in FIG. 4, the logic circuit 108 includes the first logic circuit 1081, a second logic circuit 1082, a third logic circuit 1083, and a fourth logic circuit 1084. FIG. 6 illustrates a truth table of the first logic circuit 1081. FIGS. 7A to 7D illustrate truth tables of the second logic circuit 1082. FIG. 8 illustrates a truth table of the third logic circuit 1083. FIG. 9 illustrates a truth table of the fourth logic circuit 1084. FIG. 10 illustrates signals input to and output from the logic circuit 108.

The first to eighth pins $P_1$ to $P_8$, which serve as the selection pins of the respective channels of the switch 107, are connected to the input terminals of the first logic circuit 1081. As illustrated in FIG. 5, the first logic circuit 1081 includes four AND gates 1101 in the first stage. The AND gates 1101 are connected to four pairs of separate selection pins, that is, the first pin $P_1$ and the fifth pin $P_5$, the second pin $P_2$ and the sixth pin $P_6$, the third pin $P_3$ and the seventh pin $P_7$, and the fourth pin $P_4$ and the eighth pin $P_8$.

The signals output from the AND gates 1101 are inverted by NOT gates 1102 and input to AND gates 1103 and NOR gates 1104. The signals output from the AND gates 1103 are input to NOR gates 1105. The signals output from the NOR gates 1105 are inverted by NOT gates 1106 and input to NOR gates 1108.

The signals output from the NOR gates 1104 are input to an AND gate 1107. The signal output from the AND gate 1107 is input to one of the NOR gates 1108. The signals output from the NOR gates 1108 are inverted by NOT gates 1109 and input to a NOR gate 1110. The signal output from the NOR gate 1110 is inverted by a NOT gate 1111 and output from an output terminal $S_{L1}$ of the first logic circuit 1081.

FIG. 6 illustrates a truth table of the first logic circuit 1081 having this configuration. In the truth table illustrated in FIG. 6, the digits of four-digit numbers listed in a column respectively indicate the values of the third pin $P_3$, the seventh pin $P_7$, the fourth pin $P_4$, and the eighth pin $P_8$ of the switch 107. The digits of four-digit numbers listed in a row respective indicate the values of the first pin $P_1$, the fifth pin $P_5$, the second pin $P_2$, and the sixth pin $P_6$ of the switch 107. The value 0 corresponds to the low level, whereas the value 1 corresponds to the high level.

As illustrated in FIG. 6, the signal output from the output terminal $S_{L1}$ of the first logic circuit 1081 is at a low level in twelve cases. Specifically, the cases indicate when only at least either of the first pin $P_1$ and the fifth pin $P_5$ is at a low level, when only at least either of the second pin $P_2$ and the sixth pin $P_6$ is at a low level, when only at least either of the third pin $P_3$ and the seventh pin $P_7$ is at a low level, and when only at least either of the fourth pin $P_4$ and the eighth pin $P_8$ is at a low level. The signal output from the output terminal $S_{L1}$ of the first logic circuit 1081 is at a high level in the other cases.

As illustrated in FIG. 4, the second logic circuit 1082 includes four exclusive logical sum (XOR) gates 1201. The input terminals of the XOR gates 1201 are connected to four pairs of selection pins, that is, the first pin $P_1$ and the fifth pin $P_5$, the second pin $P_2$ and the sixth pin $P_6$, the third pin $P_3$ and the seventh pin $P_7$, and the fourth pin $P_4$ and the eighth pin $P_8$. The signals output from the XOR gates 1201 are inverted by NOT gates 1202 and output to the third logic circuit 1083.

As is apparent from the truth tables illustrated in FIGS. 7A to 7D, each of the signals output from the second logic circuit 1082 is at a high level when the first pin $P_1$ and the fifth pin $P_5$, the second pin $P_2$ and the sixth pin $P_6$, the third pin $P_3$ and the seventh pin $P_7$, or the fourth pin $P_4$ and the eighth pin $P_8$ have the same value, and is at a low level when the pair of pins have different values.

As illustrated in FIG. 4, the third logic circuit 1083 includes four negative logical sum (NOR) gates 1301. The input terminals of the NOR gates 1301 receive the signal output from the first logic circuit 1081 and the signals output from the second logic circuit 1082. The signals output from the NOR gates 1301 are inverted by NOT gates 1302 and output to the fourth logic circuit 1084.

As is apparent from the truth table illustrated in FIG. 8, each of the signals output from the third logic circuit 1083 is at a low level when both the first logic circuit 1081 and the second logic circuit 1082 output signals at a low level, and is at a high level when at least either of the first logic circuit 1081 and the second logic circuit 1082 output a signal at a high level.

As illustrated in FIG. 4, the fourth logic circuit 1084 includes eight negative logical sum (NOR) gates 1401. The input terminals of the NOR gates 1401 are connected to the output terminals of the third logic circuit 1083 and the first to eighth pins $P_1$ to $P_8$. The signals output from the NOR gates 1401 are inverted by NOT gates 1402 and output.

As is apparent from the truth table illustrated in FIG. 9, each of the signals output from the fourth logic circuit 1084, that is, the logic circuit 108 is at a low level when both a signal output from the third logic circuit 1083 and the value of an selection pin of the switch 107 are at a low level, and is at a high level when at least either of the signal output from the third logic circuit 1083 and the value of the selection pin of the switch 107 is at a high level.

FIG. 10 illustrates signals input to and output from the logic circuit 108 having the above-described configuration. When receiving an ON signal at a low level input from only the first pin $P_1$ through a manipulation of turning on only the first channel of the switch 107, the logic circuit 108 outputs an ON signal at a low level from the output terminal $S_1$. Also, when receiving an ON signal at a low level input from only the fifth pin $P_5$, only the second pin $P_2$, only the sixth pin $P_6$, only the third pin $P_3$, only the seventh pin $P_7$, only the fourth pin $P_4$, or only the eighth pin $P_8$, the logic circuit 108 outputs an ON signal at a low level from the output terminal $S_5$, the output terminal $S_2$, the output terminal $S_6$, the output terminal $S_3$, the output terminal $S_7$, the output terminal $S_4$, or the output terminal $S_8$. In contrast, when two or more channels of the switch 107 are turned on or all the channels are turned off, the logic circuit 108 outputs OFF signals at a high level from all the output terminals. In other words, when only one of the first to eighth channels of the switch 107 is turned on, the logic circuit 108 outputs an ON signal from any one output terminal selected from the output terminals $S_1$ to $S_8$ independent from each other.

These signals output from the logic circuit 108 operating as described above can activate or deactivate the electronic components, such as the main clock 101, of the boards 10*a* to 10*h*. In a comparative configuration in which the switch 107 is connected directly to the enable terminals of the electronic components without the logic circuit 108, an erroneous manipulation of turning on multiple channels of the eight channels of the switch 107 results in a malfunction. Such a malfunction can be avoided by the logic circuit 108.

The configuration of the logic circuit 108 illustrated in FIGS. 4 to 9 is a mere example and may be replaced with another configuration. For example, a combination of a NOR gate and a NOT gate may be replaced with a logical sum (OR) gate. A combination of an AND gate and a NOT gate may be replaced with a NAND gate. Also, a combination of an XOR gate and a NOT gate may be replaced with a negative exclusive logical sum (NXOR) gate.

The following describes a method of fabricating the image sensor 1 having the above-described configuration, with reference to FIGS. 1 and 2.

First, the boards 21 and 22 including the A/D conversion circuits are fixed on the frame 70 provided with the sensor ICs, as illustrated in FIG. 1, in the direction of alignment of the sensor ICs, that is, the main scanning direction. The boards 21 and 22 are then provided with the boards 10*a* to 10*h* via the spacers 25 (in a board fixing step).

Manipulations are then performed on the switches 107 of the boards 10*a* to 10*h* illustrated in FIG. 2. Specifically, the manipulations involve setting only a predetermined one selection pin of each of the switches 107 of the boards 10*a* to 10*h* to ON, and setting the other selection pins to OFF. These manipulations allow one output terminal of the logic circuit 108 selected from the eight output terminals independent from each other to output an ON signal, and thus activate the corresponding electronic components (in a switch setting step).

The boards 10*a* to 10*h* are then provided with the boards 30 via the spacers 31. The boards 40 and 41, the connectors 51 and 52, and the fans 53 fixed on the cover 80 are then connected to the boards 10 and 30 fixed on the frame 70 via wires. The cover 80 is then fixed to the frame 70.

As described above, the image sensor 1 according to this embodiment includes the boards 10 including the identical components and wires, as the boards that process image signals acquired from the sensor ICs. Each of the boards 10 includes the switch 107, and the logic circuit 108 that performs logical operations to signals from the switch 107 and outputs resulting signals. The logic circuit 108 performs logical operations and thus outputs a signal at a low level from any one output terminal selected from the output terminals $S_1$ to $S_8$ independent from each other, when only one of the first to eighth pins $P_1$ to $P_8$ of the switch 107 is set at a low level. The signals output from the logic circuit 108 are input to the enable terminals of the buffers 102, 104, and 105 and thus activate or deactivate the buffers. That is, a single type of circuit boards for image processing can achieve an elongated image sensor, without multiple types of circuit boards. Such an image sensor including a single type of circuit boards can be fabricated by a simpler fabrication process.

A comparative image sensor including a microcomputer or FPGA for selecting the functions of boards requires several milliseconds to several seconds for the activation process after a power-on manipulation. This activation process can be significantly shortened in the embodiment, because the functions of boards are selected by combinations of logical gates. The embodiment achieves the selection of the functions of boards with a simple structure including the switches 107 and the logic circuits 108, leading to cost reduction.

Embodiment 2

An image sensor 1 according to Embodiment 2 of the present disclosure is a line sensor including linearly aligned sensor ICs and having the same configuration as the image sensor 1 according to Embodiment 1. Embodiment 2 differs from Embodiment 1 in the configuration of logic circuits 128 mounted on the boards 10. The image sensor 1 according to Embodiment 2 is described in detail below with reference to the accompanying drawings.

Figure 11:
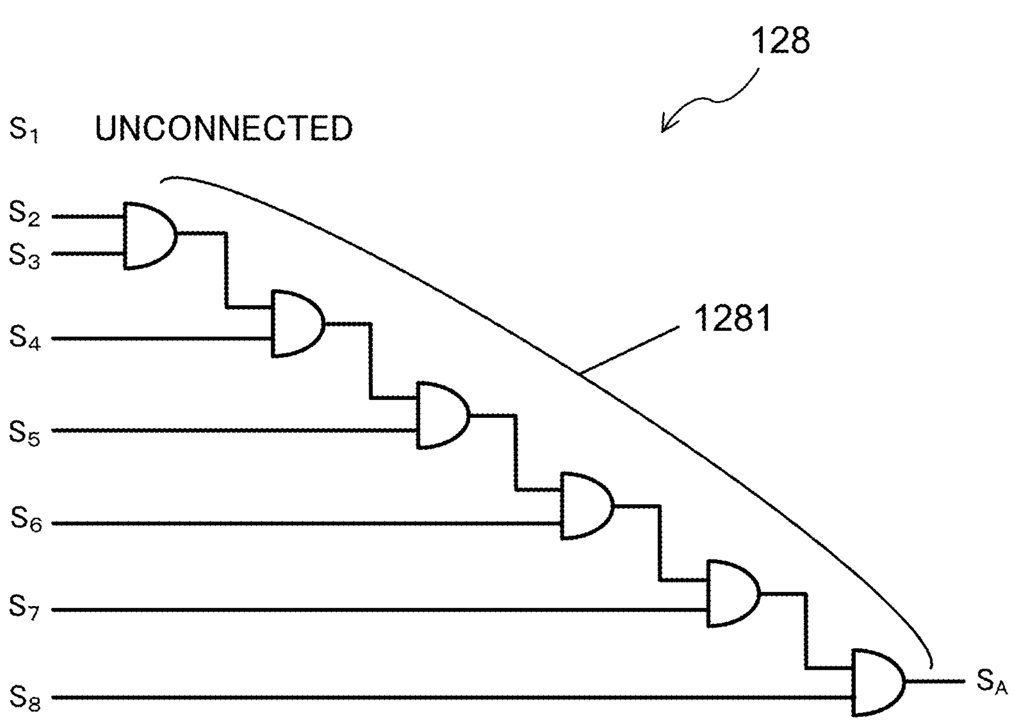
FIG. 11 is a circuit diagram illustrating a logic circuit according to Embodiment 2.

FIG. 11 illustrates a partial configuration of each of the logic circuits 128 according to Embodiment 2. The logic circuit 128 includes, in addition to the logic circuit 108 according to Embodiment 1, a multi-input AND gate 1281 made of multiple AND gates between the logic circuit 108 and a certain electronic component. That is, the logic circuit 128 includes the multi-input AND gate 1281 that outputs a logical product of signals output from all the output terminals other than the one output terminal selected from the output terminals $S_1$ to $S_8$ of the fourth logic circuit 1084, as illustrated in FIG. 11. The logic circuit 128 sequentially provides logical products of signals output from the output terminals $S_2$ to $S_8$ other than the output terminal $S_1$ in FIG. 11. The logic circuit 128 thus outputs a signal at a low level from the output terminal $S_A$ when any of the signals output from the output terminals $S_2$ to $S_8$ are at a low level, and outputs a signal at a high level from the output terminal $S_A$ when all the signals output from the output terminals $S_2$ to $S_8$ are at a high level.

The signal output from the output terminal $S_A$ of the logic circuit 128 is input to the enable terminal of the certain electronic component as an enable signal, and can thus activate or inactivate the certain electronic component. A typical example of the certain electronic component is the main clock 101. In this case, the signal output from the output terminal $S_A$ can start or stop the oscillation of the clock.

The buffers 102, 104, and 105, which are the other electronic components, are connected directly to one output terminal selected from the output terminals $S_1$ to $S_8$ of the fourth logic circuit 1084, and are thus activated or deactivated.

That is, the switches 107 and the logic circuits 128 enable a single type of circuit boards for image processing to achieve an elongated image sensor 1, without multiple types of circuit boards. Such an image sensor 1 including a single type of circuit boards can be fabricated by a simpler fabrication process.

As described above, in the image sensor 1 according to the embodiment, the logic circuit 128 for outputting an enable signal includes the multi-input AND gate 1281 that outputs a logical product of signals output from all the output terminals other than the one output terminal selected from the output terminals $S_1$ to $S_8$ of the fourth logic circuit 1084. The image sensor 1 uses the signal output from the output terminal $S_A$ of the logic circuit 1281 as an enable signal, and can thus certainly activate or deactivate the electronic component.

In Embodiments 1 and 2 described above, the switch 107 has eight channels and the logic circuit 108 has eight output terminals. The same effects can be provided when the switch 107 has four to seven channels and the logic circuit 108 has four to seven output terminals.

For example, the switch 107 having four channels can bring about the same effects by fixing (pulling up) the fifth pin $P_5$, the sixth pin $P_6$, the seventh pin $P_7$, and the eighth pin $P_8$ of the first logic circuit 1081 at a high level. Also, the switch 107 having five channels can bring about the same effects by fixing the sixth pin $P_6$, the seventh pin $P_7$, and the eighth pin $P_{\&}$ of the first logic circuit 1081 at a high level. The switch 107 having six channels can bring about the same effects by fixing the seventh pin $P_7$ and the eighth pin $P_8$ of the first logic circuit 1081 at a high level. The switch 107 having seven channels can bring about the same effects by fixing the eighth pin $P_8$ of the first logic circuit 1081 at a high level.

In the switch 107 having four to seven channels, some of the output terminals $S_5$, $S_6$, $S_7$, and $S_8$ of the fourth logic circuit 1084, corresponding to the pins fixed at a high level among the fifth pin $P_5$, the sixth pin $P_6$, the seventh pin $P_7$, and the eighth pin $P_8$ of the first logic circuit 1081, are fixed (pulled up) at a high level, because the signals output from these output terminals are always at a high level.

The above description of Embodiments 1 and 2 is focused on the configuration of the logic circuit 108 as an exemplary logic circuit that outputs enable signals. The logic circuit 108 may be replaced with any other logic circuit that performs logical operations for outputting an ON or OFF signal from any one output terminal selected from four or more output terminals independent from each other in response to input of four or more ON or OFF signals.

Figure 12:
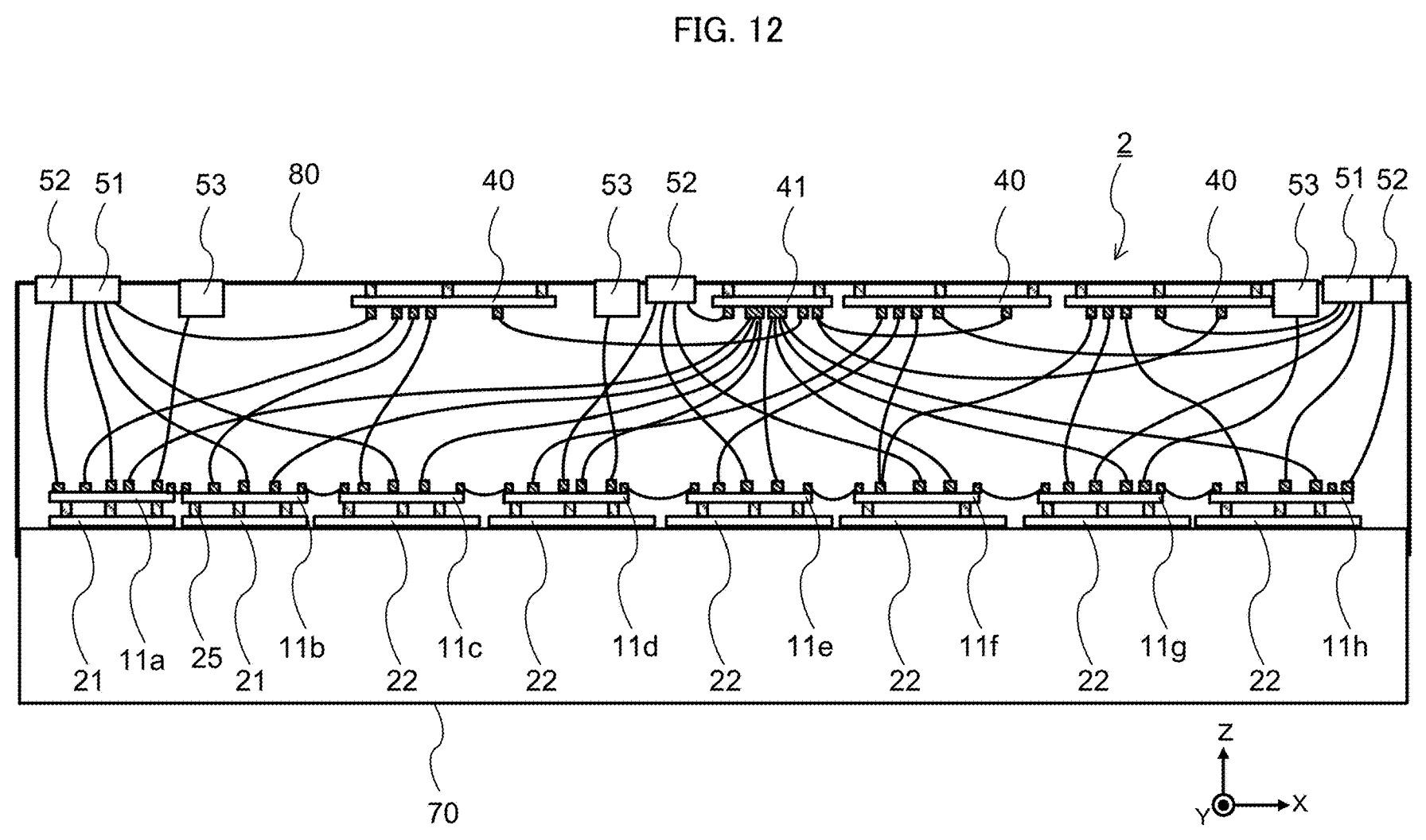

Although the boards 10*a* to 10*h* are circuit boards of a single type and the functions of the boards 10 are switched using the switches 107 and the logic circuits 108 or 128 in Embodiments 1 and 2 described above, this configuration is a mere example. For example, the boards 10 may have the functions of the boards 30. That is, as illustrated in FIG. 12, boards 11 (11*a* to 11*h*) having the functions of the boards 10 and 30 may be circuit boards of a single type, and the functions of the boards 11 may be switched by the switches 107 and the logic circuits 108 or 128. FIG. 12 illustrates an image sensor 2 according to a modification. This modification can further reduce the number of types of boards.

Hereinafter, various aspects of the present disclosure are described as appendices.

APPENDIX 1

A circuit board, comprising:

a switch including four or more selection pins;

a logic circuit to output an ON signal from one output terminal, when receiving an ON signal input from only a predetermined one selection pin of the selection pins and receiving OFF signals input from all of others of the selection pins, the one output terminal being selected from four or more output terminals independent from each other; and electronic components to be activated or deactivated in accordance with signals output from the logic circuit.

APPENDIX 2

The circuit board according to appendix 1, wherein the switch is a physical switch including eight selection pins, and the logic circuit includes a first logic circuit to output an ON signal when receiving an ON signal input from only at least either of the predetermined one selection pin of the selection pins or another selection pin located apart from the predetermined one selection pin.

APPENDIX 3

The circuit board according to appendix 2, wherein the logic circuit further includes a second logic circuit to provide an exclusive logical sum of a signal input from the predetermined one selection pin and a signal input from the another selection pin, a third logic circuit to provide a logical sum of a signal output from the first logic circuit and a signal output from the second logic circuit, and a fourth logic circuit to provide a logical sum of a signal input from each of the eight selection pins and a signal output from the third logic circuit.

APPENDIX 4

The circuit board according to any one of appendices 1 to 3, wherein the logic circuit includes a multi-input AND gate to output a logical product of signals output from all the output terminals other than the selected one output terminal, and at least one of the electronic components is activated or deactivated in accordance with a signal output from the multi-input AND gate.

APPENDIX 5

The circuit board according to any one of appendices 1 to 4, wherein the electronic components include a clock or a buffer.

APPENDIX 6

An image sensor, comprising:

a plurality of the circuit board according to any one of appendices 1 to 5, wherein the image sensor performs image processing on signals output from sensor ICs, using the electronic components activated by selection of any one of the selection pins of the switch of each of the circuit boards.

APPENDIX 7

A method of fabricating an image sensor, the method comprising:

a board fixing step of fixing boards for image processing on a frame in a direction of alignment of sensor ICs fixed on the frame, each of the boards including a switch including four or more selection pins, a logic circuit to perform logical operations on signals input from the selection pins, and electronic components to be activated or deactivated in accordance with signals output from the logic circuit; and a switch setting step of setting only a predetermined one selection pin of the selection pins to ON, setting all of others of the selection pins to OFF, and thus causing the logic circuit to output, from one output terminal, a signal for activating the electronic components, the one output terminal being selected from four or more output terminals independent from each other.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1, 2 Image sensor
10, 10*a* to 10*h*, 11, 12*a* to 11*h*, 21, 22, 30 Board
25, 31 Spacer
40, 41 Board
51, 52 Connector
53 Fan
70 Frame
80 Cover
101 Main clock
102, 104, 105 Buffer
103 Connector
106 FPGA
107 Switch
108, 128 Logic circuit
109 Wire
110 Cable
1081 First logic circuit
1082 Second logic circuit
1083 Third logic circuit
1084 Fourth logic circuit
1101, 1103, 1107 AND gate
1102, 1106, 1109, 1111 NOT gate
1104, 1105, 1108, 1110 NOR gate
1201 XOR gate
1202, 1302, 1402 NOT gate
1301, 1401 NOR gate
1501 AND gate

The invention claimed is:

1. A circuit board, comprising:

a physical switch including eight selection pins of a first pin to an eighth pin;

a logic circuit to output an ON signal from one output terminal, when receiving an ON signal at a low level from only a predetermined one selection pin of the selection pins and receiving OFF signals at a high level from all of others of the selection pins, the one output terminal being selected from eight output terminals independent from each other; and electronic components to be activated or deactivated in accordance with signals output from the logic circuit, wherein the logic circuit includes a first logic circuit to output the ON signal when receiving the ON signal from only at least either selection pin of each of four pairs of separate selection pins that are a pair of the first pin and the fifth pin, a pair of the second pin and the sixth pin, a pair of the third pin and the seventh pin, and a pair of the fourth pin and the eighth pin, a second logic circuit to determine a negative exclusive logical sum of a signal input from one selection pin of each pair of selection pins and a signal input from the other selection pin of each pair of selection pins for each of the pair of the first pin and the fifth pin, the pair of the second pin and the sixth pin, the pair of the third pin and the seventh pin, and the pair of the fourth pin and the eighth pin, and output the OFF signal from a pair of selection pins that both receive the ON signals, a third logic circuit to provide a logical sum of a signal output from the first logical circuit and a signal output from the second logic circuit, and a fourth logic circuit to provide a logical sum of a signal input from each of the eight selection pins and a signal corresponding to the each of the eight selection pins among signals output from the third logic circuit, and the fourth logic circuit provides output signals from eight output terminals independent from each other.

2. The circuit board according to claim 1, wherein the logic circuit includes a multi-input AND gate to output a logical product of signals output from all the output terminals other than the selected one output terminal, and at least one of the electronic components is activated or deactivated in accordance with a signal output from the multi-input AND gate.

3. An image sensor, comprising:

a plurality of the circuit board according to claim 2, wherein the image sensor performs image processing on signals output from sensor ICs, using the electronic components activated by selection of any one of the selection pins of the physical switch of each of the circuit boards.

4. The circuit board according to claim 1, wherein the electronic components include a clock or a buffer.

5. An image sensor, comprising:

a plurality of the circuit board according to claim 4, wherein the image sensor performs image processing on signals output from sensor ICs, using the electronic components activated by selection of any one of the selection pins of the physical switch of each of the circuit boards.

6. An image sensor, comprising:

a plurality of the circuit board according to claim 1, wherein the image sensor performs image processing on signals output from sensor ICs, using the electronic components activated by selection of any one of the selection pins of the physical switch of each of the circuit boards.

7. A method of fabricating an image sensor, the method comprising:

a board fixing step of fixing boards for image processing on a frame in a direction of alignment of sensor ICs fixed on the frame, each of the boards including a physical switch including eight selection pins of a first pin to an eighth pin, a logic circuit to perform logical operations on signals input from the selection pins, and electronic components to be activated or deactivated in accordance with signals output from the logic circuit; and a switch setting step of setting only a predetermined one selection pin of the selection pins to ON, setting all of others of the selection pins to OFF, and thus causing the logic circuit to output, from one output terminal, a signal for activating the electronic components, the one output terminal being selected from eight output terminals independent from each other, wherein the logic circuit includes a first logic circuit to output an ON signal when receiving an ON signal at a low level from only at least either selection pin of each of four pairs of separate selection pins that are a pair of the first pin and the fifth pin, a pair of the second pin and the sixth pin, a pair of the third pin and the seventh pin, and a pair of the fourth pin and the eighth pin, a second logic circuit to determine a negative exclusive logical sum of a signal input from one selection pin of each pair of selection pins and a signal input from the other selection pin of each pair of selection pins for each of the pair of the first pin and the fifth pin, the pair of the second pin and the sixth pin, the pair of the third pin and the seventh pin, and the pair of the fourth pin and the eighth pin, and output an OFF signal at a high level from a pair of selection pins that both receive the ON signals, a third logic circuit to provide a logical sum of a signal output from the first logical circuit and a signal output from the second logic circuit, and a fourth logic circuit to provide a logical sum of a signal input from each of the eight selection pins and a signal corresponding to the each of the eight selection pins among signals output from the third logic circuit, and the fourth logic circuit provides output signals from eight output terminals independent from each other.

* * * * *